United States Patent
Leobandung

(10) Patent No.: US 11,195,842 B2
(45) Date of Patent: Dec. 7, 2021

(54) VERTICAL NON-VOLATILE MEMORY STRUCTURE WITH ADDITIONAL BITLINE IN WORDLINE STACK

(71) Applicant: International Business Machines Corporation, Armonk, NY (US)

(72) Inventor: Effendi Leobandung, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 125 days.

(21) Appl. No.: 16/734,817

(22) Filed: Jan. 6, 2020

(65) Prior Publication Data
US 2021/0210498 A1    Jul. 8, 2021

(51) Int. Cl.
| H01L 27/11556 | (2017.01) |
| G11C 8/14 | (2006.01) |
| G11C 7/18 | (2006.01) |
| H01L 27/11524 | (2017.01) |

(52) U.S. Cl.
CPC .......... H01L 27/11556 (2013.01); G11C 7/18 (2013.01); G11C 8/14 (2013.01); H01L 27/11524 (2013.01)

(58) Field of Classification Search
CPC ......... H01L 27/11556; H01L 27/11524; H01L 27/11573; H01L 27/11575; H01L 27/11582; G11C 8/14; G11C 7/18; G11C 16/0483

See application file for complete search history.

(56) References Cited

U.S. PATENT DOCUMENTS

| 5,292,678 | A | 3/1994 | Dhong et al. |
| 7,280,401 | B2 | 10/2007 | Di Gregorio |
| 8,501,609 | B2 | 8/2013 | Roizin et al. |
| 8,830,740 | B2 | 9/2014 | Sasago et al. |

(Continued)

FOREIGN PATENT DOCUMENTS

CN    105427883 B    9/2018

OTHER PUBLICATIONS

Samsung, "Samsung V-NAND Technology," White Paper from Samsung Electronics Co., Ltd., Sep. 2014, 8 pages.

(Continued)

*Primary Examiner* — Allison Bernstein
(74) *Attorney, Agent, or Firm* — Robert Sullivan; Ryan, Mason & Lewis, LLP

(57) ABSTRACT

A method of forming a semiconductor structure includes forming a wordline stack for a non-volatile memory structure over a capping layer, the wordline stack including sets of alternating layers of insulating and gate materials each having a different width. The method also includes forming a first bitline contact layer between first and second portions of the wordline stack each including at least one of the sets. The method further includes forming a floating gate device structure vertically in a channel hole through the wordline stack, the first bitline contact layer and the capping layer. The method further includes forming wordline contacts to the gate layers and a first bitline contact to the first bitline contact layer in holes paced apart from vertical sidewalls of the floating gate device structure, and forming a second bitline contact over at least a portion of a top surface of the floating gate device structure.

20 Claims, 14 Drawing Sheets

(56) References Cited

U.S. PATENT DOCUMENTS

| | | | |
|---|---|---|---|
| 9,035,372 B2 * | 5/2015 | Song | ............... H01L 29/66833 |
| | | | 257/324 |
| 10,199,326 B1 | 2/2019 | Ohsaki | |
| 2014/0231954 A1 | 8/2014 | Lue | |

OTHER PUBLICATIONS

R. Micheloni et al., "Architectural and Integration Options for 3D NAND Flash Memories," Computers, Aug. 10, 2017, 19 pages, vol. 6, No. 3.

* cited by examiner

150

100

200

400

600

700

1000

1100

1200

VERTICAL NON-VOLATILE MEMORY STRUCTURE WITH ADDITIONAL BITLINE IN WORDLINE STACK

BACKGROUND

The present application relates to semiconductors, and more specifically, to techniques for forming semiconductor structures. Semiconductors and integrated circuit chips have become ubiquitous within many products, particularly as they continue to decrease in cost and size. There is a continued desire to reduce the size of structural features and/or to provide a greater amount of structural features for a given chip size. Miniaturization, in general, allows for increased performance at lower power levels and lower cost. Present technology is at or approaching atomic level scaling of certain micro-devices such as logic gates, field-effect transistors (FETs), and capacitors.

SUMMARY

Embodiments of the invention provide techniques for forming vertical non-volatile memory structures with one or more additional bitlines formed in a wordline stack.

In one embodiment, a method of forming a semiconductor structure comprises forming a wordline stack for a non-volatile memory structure over a capping layer, the wordline stack comprising two or more sets of alternating layers of an insulating material and a gate material formed over the insulating material, each of the two or more sets of the insulating material layer and the gate material layer in the wordline stack having a different width. The method also comprises forming a first bitline contact layer between first and second portions of the wordline stack, the first and second portions of the wordline stack each comprising at least one of the two or more sets of the insulating material layer and the gate material layer. The method further comprises forming a floating gate device structure vertically in a channel hole through the wordline stack, the first bitline contact layer and the capping layer. The method further comprises forming wordline contacts to the gate layers in the first and second portions of the wordline stack, the wordline contacts being formed in wordline contact holes spaced apart from vertical sidewalls of the floating gate device structure. The method further comprises forming a first bitline contact to the first bitline contact layer, the first bitline contact being formed in a first bitline contact hole spaced apart from the vertical sidewalls of the floating gate device structure. The method further comprises forming a second bitline contact over at least a portion of a top surface of the floating gate device structure.

In another embodiment, a semiconductor structure comprises a capping layer and a wordline stack for a vertical non-volatile memory structure disposed over the capping layer, the wordline stack comprising two or more sets of alternating layers of an insulating material and a gate material disposed over the insulating material, each of the two or more sets of the insulating material layer and the gate material layer in the wordline stack having a different width. The semiconductor structure also comprises a first bitline contact layer disposed between first and second portions of the wordline stack, the first and second portions of the wordline stack each comprising at least one of the two or more sets of the insulating material layer and the gate material layer. The semiconductor structure further comprises a floating gate device structure disposed vertically in a channel hole through the wordline stack, the first bitline contact layer and the capping layer. The semiconductor structure further comprises wordline contacts to the gate layers in the first and second portions of the wordline stack, the wordline contacts being disposed in wordline contact holes spaced apart from vertical sidewalls of the floating gate device structure. The semiconductor structure further comprises a first bitline contact to the first bitline contact layer, the first bitline contact being disposed in a first bitline contact hole spaced apart from the vertical sidewalls of the floating gate device structure. The semiconductor structure further comprises a second bitline contact disposed over at least a portion of a top surface of the floating gate device structure.

In another embodiment, an integrated circuit comprises a vertical non-volatile memory structure comprising a capping layer and a wordline stack for a vertical non-volatile memory structure disposed over the capping layer, the wordline stack comprising two or more sets of alternating layers of an insulating material and a gate material disposed over the insulating material, each of the two or more sets of the insulating material layer and the gate material layer in the wordline stack having a different width. The vertical non-volatile memory structure also comprises a first bitline contact layer disposed between first and second portions of the wordline stack, the first and second portions of the wordline stack each comprising at least one of the two or more sets of the insulating material layer and the gate material layer. The vertical non-volatile memory structure further comprises a floating gate device structure disposed vertically in a channel hole through the wordline stack, the first bitline contact layer and the capping layer. The vertical non-volatile memory structure further comprises wordline contacts to the gate layers in the first and second portions of the wordline stack, the wordline contacts being disposed in wordline contact holes spaced apart from vertical sidewalls of the floating gate device structure. The vertical non-volatile memory structure further comprises a first bitline contact to the first bitline contact layer, the first bitline contact being disposed in a first bitline contact hole spaced apart from the vertical sidewalls of the floating gate device structure. The vertical non-volatile memory structure further comprises a second bitline contact disposed over at least a portion of a top surface of the floating gate device structure.

DETAILED DESCRIPTION

Figure 1B:
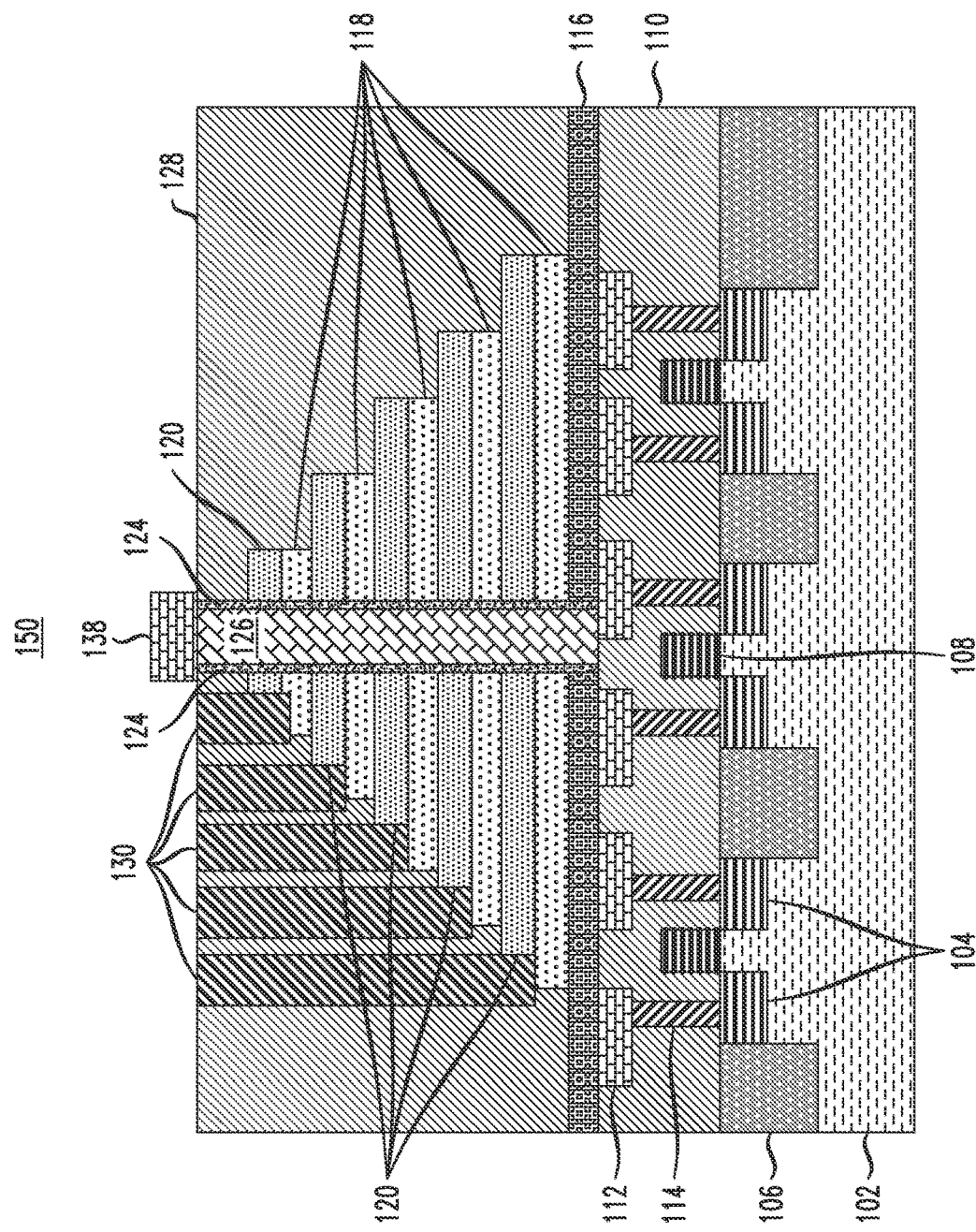
FIG. 1B depicts a side cross-sectional view of the vertical non-volatile memory structure of FIG. 1A, according to an embodiment of the invention.

Illustrative embodiments of the invention may be described herein in the context of illustrative methods for forming vertical non-volatile memory structures with one or more additional bitlines in a wordline stack, along with illustrative apparatus, systems and devices formed using such methods. However, it is to be understood that embodiments of the invention are not limited to the illustrative methods, apparatus, systems and devices but instead are more broadly applicable to other suitable methods, apparatus, systems and devices.

A field-effect transistor (FET) is a transistor having a source, a gate, and a drain, and having action that depends on the flow of charge carriers along a channel that runs past the gate between the source and drain. Current through the channel between the source and drain may be controlled by a transverse electric field under the gate.

FETs are widely used for switching, amplification, filtering, and other tasks. FETs include metal-oxide-semiconductor (MOS) FETs (MOSFETs). Complementary MOS (CMOS) devices are widely used, where both n-type and p-type transistors (nFET and pFET) are used to fabricate logic and other circuitry. Source and drain regions of a FET are typically formed by adding dopants to target regions of a semiconductor body on either side of a channel, with the gate being formed above the channel. The gate includes a gate dielectric over the channel and a gate conductor over the gate dielectric. The gate dielectric is an insulator material that prevents large leakage current from flowing into the channel when voltage is applied to the gate conductor while allowing applied gate voltage to produce a transverse electric field in the channel.

FETs may be used in forming memory such as flash memory. Flash memory provides desirable characteristics such as durability and speed. Flash memory generally comprises an array of cells which record one or several bits (e.g., 0s and 1s), with each cell including a floating gate transistor that traps an electrical charge to indicate a 0 or 1 value. Single-level cells store one bit, while multi-level cells store two or more bits.

Flash memory may be generally characterized as one of two types—NOR and NAND, referring to the logic gates used in the memory cells thereof. NOR-based flash memory has the advantages of each byte being individually readable, writeable and erasable and can be faster than NAND. NOR-based flash memory, however, is typically more expensive than NAND-based flash memory and is less dense (e.g., approximately 60% less dense). NOR-based flash memory may be embedded in devices such as mobile phones, small appliances, etc. NAND-based flash memory may be used in solid state devices (SSDs) and other application areas. In NAND-based flash memory, hundreds to thousands of cells may be arranged on pages, with one or more pages on a single block. A chip may include multiple blocks. Block management is used for writing and erasing data, and data is generally read on a page basis. Thus, NAND-based flash memory is not as suitable for byte-level random access (e.g., as may be required for read-only memory (ROM)) compared to NOR-based flash memory. NAND-based flesh memory, however, may be particularly useful for sequential access applications, and NAND-based flash memory may have better endurance than NOR-based flash memory in addition to faster write and erase speeds resulting from the way data is organized in blocks.

Vertical NAND and NOR, also referred to as 3D NAND and 3D NOR, is a technology where planar NAND- or NOR-based flash memory including single planes of NAND or NOR cells are stacked vertically. The vertical arrangement of cells results in increased memory capacity with lower production costs and power requirements as well as increased speed and longevity relative to planar NAND- or NOR-based flash memory.

Vertical NAND and NOR allow stacking of floating gate memory devices. As more and more devices are stacked, however, the overall channel resistance increases causing issues with reads and writes. In illustrative embodiments, one or more additional bitlines are inserted in between the stack of floating gate memory devices to reduce the overall channel resistance. The stack of floating gate memory devices provides a vertical non-volatile memory (NVM) structure, where there are connections for both bitlines and wordlines inside the vertical structure. The contacts to one or more of the bitlines, in addition to wordline contacts, may be made on the side of the vertical NVM structure.

Figure 1A:
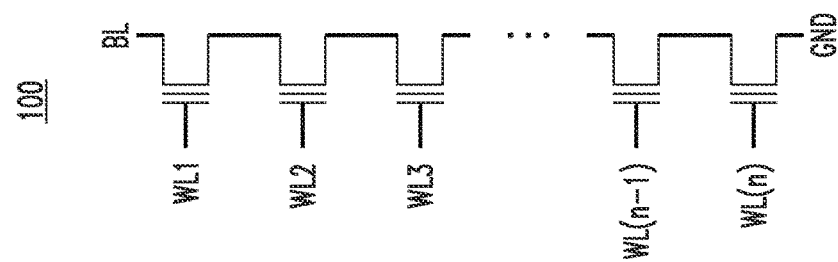
FIG. 1A depicts a circuit diagram of a vertical non-volatile memory structure, according to an embodiment of the invention.

FIG. 1A shows a circuit diagram 100 of a vertical NVM structure, specifically a vertical or 3D NAND structure, with a set of n field-effect transistors (FETs) connected in series. Each of the n FETs corresponds to a cell 1, 2, 3, . . . , n−1, n of a stacked floating gate memory structure. Voltages applied to the gates of the n FETs control wordlines (WL), denoted as WL1, WL2, WL3, . . . WL(n−1), WL(n). The source/drain of WL1 is coupled to a bitline (BL) node, and the source/drain of WL(n) is coupled to ground (GND).

To write (e.g., to inject electrons) to a specific cell such as cell 2 corresponding to WL2, a small voltage (e.g., in the range of about 0-1 volts (V)) is applied to the BL node, and a large voltage (e.g., in the range of about 5-8V) is applied to WL2, and a medium voltage (e.g., about 3V) is applied to the remaining wordlines WL1, WL3, . . . WL(n−1), WL(n).

To erase (e.g., to extract electrons) from a specific cell such as cell 2 corresponding to WL2, a small voltage (e.g., in the range of about 0-1V) is applied to the BL node, a large negative voltage (e.g., in the range of about −5 to −8V) is applied to WL2, and a medium voltage (e.g., about 3V) is applied to the remaining wordlines WL1, WL3, . . . WL(n−1), WL(n).

To read a specific cell such as cell 2 corresponding to WL2, a medium voltage (e.g., about 3V) is applied to the remaining wordlines WL1, WL3, . . . WL(n−1), WL(n) to ensure that the cells 1, 3, . . . n−1, n turn on independent of state. A smaller voltage (e.g., 1-2V) is applied to WL2. If cell 2 has electrons on the floating gate trap, the Vt of cell 2 is high and will not turn on such that the state of cell 2 is read as "0". If cell 2 has no electrons on the floating gate trap, Vt is low and will turn on such that the state of cell 2 is read as "1".

FIG. 1B shows a side cross-sectional view 150 of the 3D NAND, including a substrate 102, source/drain regions 104, shallow trench isolation (STI) layers 106, gate structures 108, an interlayer dielectric (ILD) layer 110, source/drain contacts 112 to the source/drain regions 104 via source/drain contact vias 114, and a dielectric capping layer 116. In the FIG. 1B structure, the "middle" FET provides a pass gate FET for the 3D NAND, and the "left" and "right" FETs are assumed to comprise peripheral logic FETs. The 3D NAND structure further includes a wordline stack including alternating nitride layers 118 and metal layers 120. The wordline stack has a staircase structure as illustrated. A channel is formed in the wordline stack vertically, which includes a floating gate dielectric 124 and a floating gate layer 126. An ILD layer 128 is formed surrounding the wordline stack. Wordline contacts 130 are formed to the metal layers 120. A bitline contact 138 to the floating gate layer 126 is formed as shown.

Figure 2:
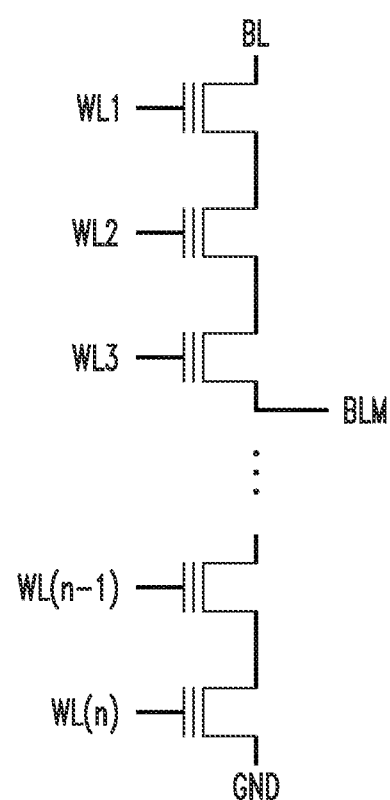
FIG. 2 depicts a circuit diagram of a vertical non-volatile memory structure with an additional bitline, according to an embodiment of the invention.
Figure 13A:
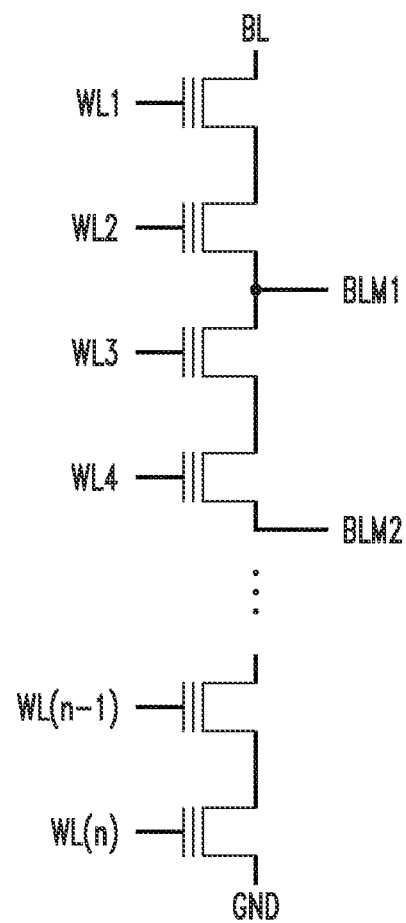
FIG. 13A depicts a circuit diagram of a vertical non-volatile memory structure with multiple additional bitlines, according to an embodiment of the invention.
Figure 13B:
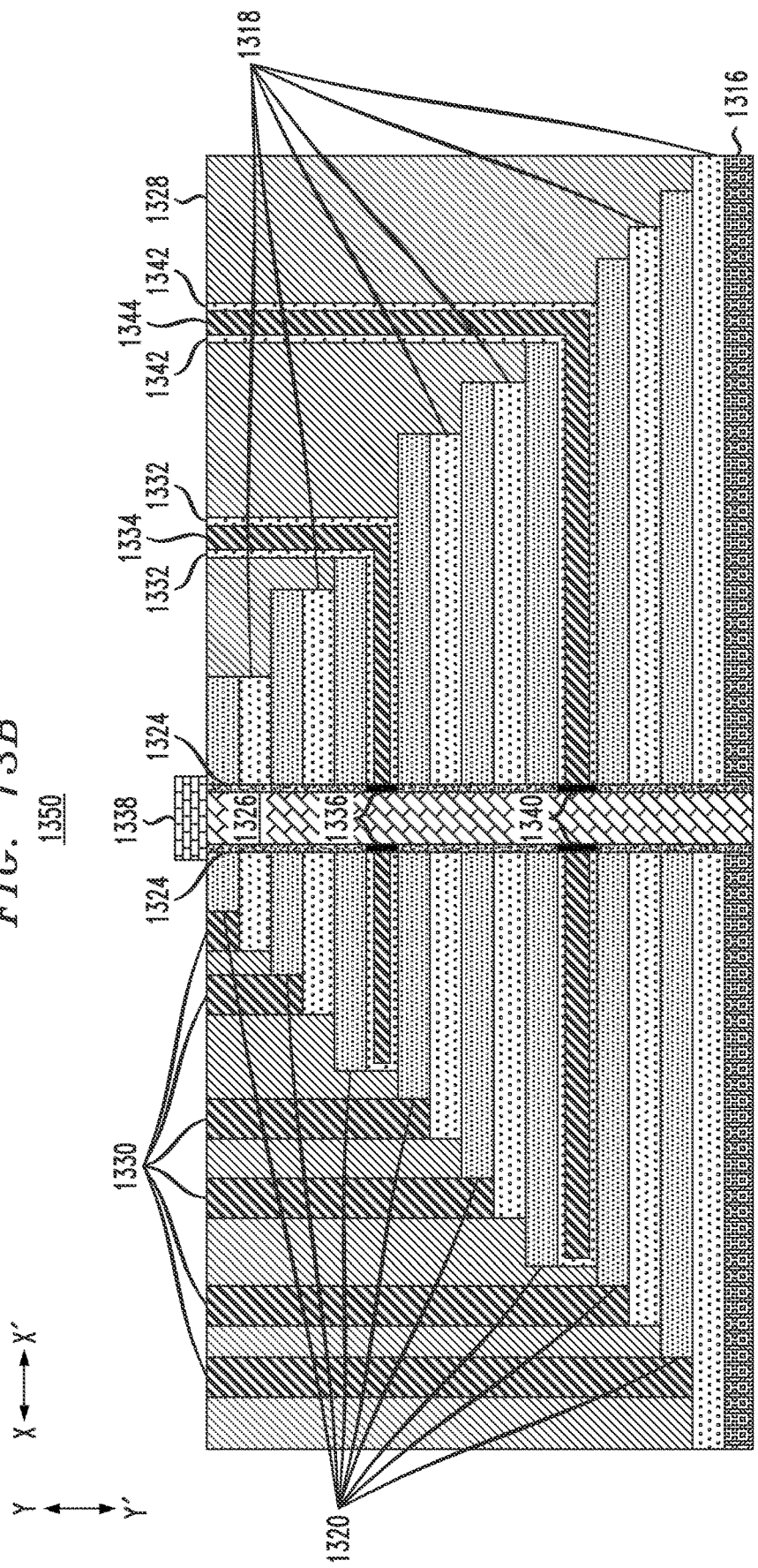
FIG. 13B depicts a side cross-sectional view of the non-volatile memory structure of FIG. 13A, according to an embodiment of the invention.

FIG. 2 shows a circuit diagram 200 of a vertical NVM structure with a set of n FETs connected in series, with each of the n FETs corresponding to a cell 1, 2, 3, . . . n of a stacked floating gate memory structure. Whereas each of the n cells in the FIG. 1 circuit diagram 100 are controlled using a bitline node BL and ground GND, the FIG. 2 circuit diagram 200 includes an additional bitline node, denoted as BLM (e.g., "bitline middle") that is placed in the middle of the FETs connected in series. To control the cells 1, 2, 3 on one side of the BLM node, BL and BLM are used. To control the cells 4 through n on the other side of the BLM node, BLM and GND are used. In this way, the series resistance of the floating gate memory structure is cut in half. Although FIG. 2 shows a circuit diagram 200 which includes just a single additional bitline node BLM, it should be appreciated that in other embodiments multiple additional bitline nodes may be inserted as desired to provide corresponding reduction in series resistance. FIGS. 13A and 13B, which are described in further detail below, show an embodiment with two additional bitlines rather than one additional bitline. There is a tradeoff, however, between the process complexity of forming such additional bitlines and reduction in series resistance achieved.

A process for forming the vertical NVM structure shown in the circuit diagram 200 of FIG. 2 will now be described with respect to FIGS. 3-12.

Figure 3:
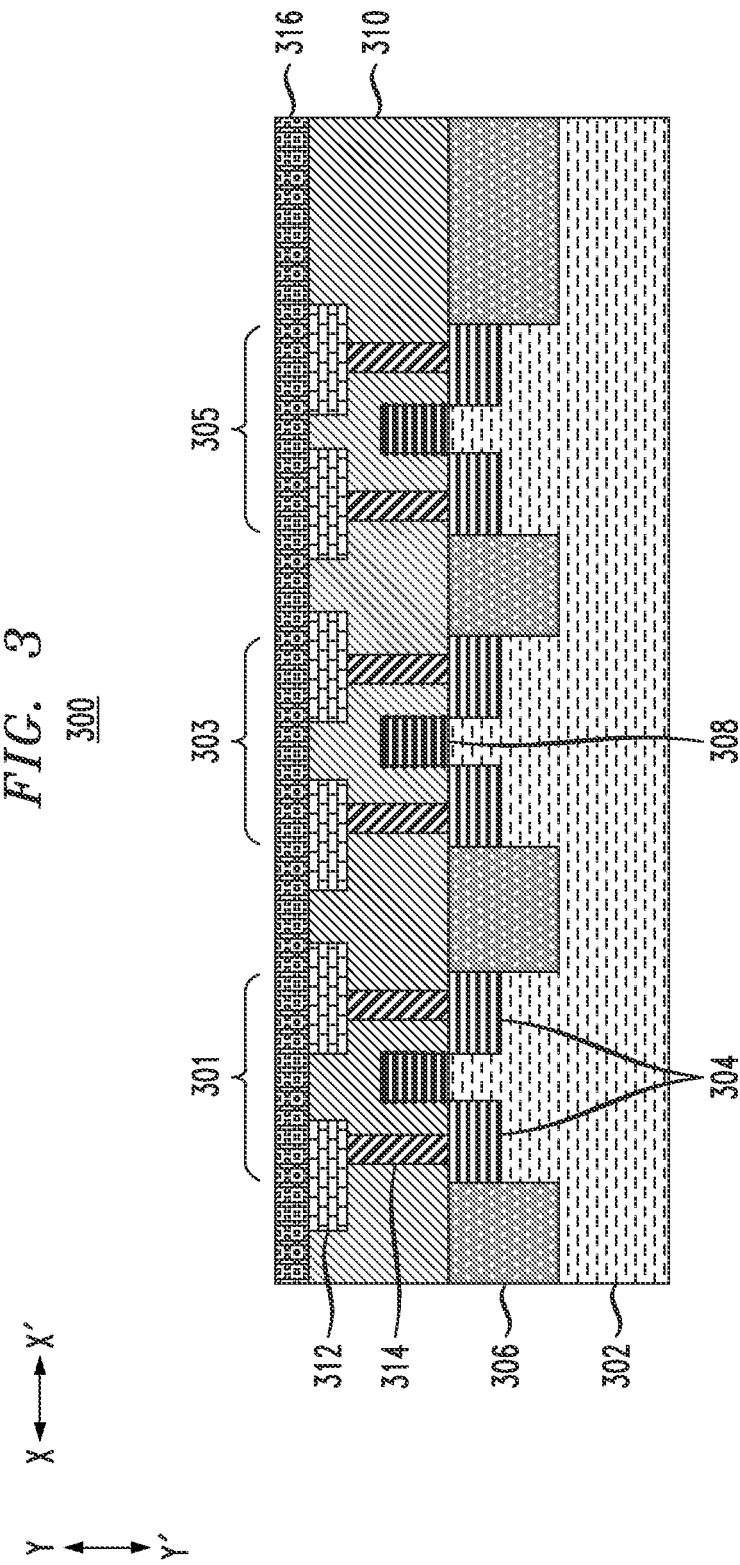
FIG. 3 depicts a side cross-sectional view of transistors of a vertical non-volatile memory structure, according to an embodiment of the invention.

FIG. 3 shows a side cross-sectional view 300 of a semiconductor structure including a substrate 302, source/drain regions 304, STI or isolation regions 306, gate structures 308, an ILD or isolation layer 310, source/drain contacts 312, source/drain contact vias 314, and a dielectric capping layer 316. The semiconductor structure shown in FIG. 3 includes three FETs, a first peripheral FET 301, a middle FET 303 and a second peripheral FET 305. The first and third peripheral FETs 301 and 305 are assumed to provide logic for one or more devices, while the middle FET 303 provides a pass gate transistor of the logic gate that is formed. The logic gate may comprise a NAND or NOR gate.

The substrate 302 may comprise a semiconductor substrate formed of silicon (Si), although other suitable materials may be used. For example, the substrate 302 can include any suitable substrate structure, e.g., a bulk semiconductor. The substrate 302 can include a silicon-containing material. Illustrative examples of Si-containing materials suitable for the substrate 302 can include, but are not limited to, Si, silicon germanium (SiGe), silicon germanium carbide (SiGeC), silicon carbide (SiC) and multi-layers thereof. Although silicon is the predominantly used semiconductor material in wafer fabrication, alternative semiconductor materials can be employed as additional layers, such as, but not limited to, germanium (Ge), gallium arsenide (GaAs), gallium nitride (GaN), SiGe, cadmium telluride (CdTe), zinc selenide (ZnSe), etc. The size of the substrate 302 may vary, such as based on the number of FETs or other features that will be formed thereon.

The source/drain regions 304 may be formed by doping portions of the substrate 302, by epitaxial growth, etc. The source/drain regions 304 may be suitably doped, such as using ion implantation, gas phase doping, plasma doping, plasma immersion ion implantation, cluster doping, infusion doping, liquid phase doping, solid phase doping, etc. N-type dopants may be selected from a group of phosphorus (P), arsenic (As) and antimony (Sb), and p-type dopants may be selected from a group of boron (B), boron fluoride ($BF_2$), gallium (Ga), indium (In), and thallium (Tl). As discussed above, the source/drain regions 304 may be formed by an epitaxial growth process. In some embodiments, the epitaxy process comprises in-situ doping (dopants are incorporated in epitaxy material during epitaxy). Epitaxial materials may be grown from gaseous or liquid precursors. Epitaxial materials may be grown using vapor-phase epitaxy (VPE), molecular-beam epitaxy (MBE), liquid-phase epitaxy (LPE), rapid thermal chemical vapor deposition (RTCVD), metal organic chemical vapor deposition (MOCVD), ultra-high vacuum chemical vapor deposition (UHVCVD), low-pressure chemical vapor deposition (LPCVD), limited reaction processing CVD (LRPCVD), or other suitable processes. Epitaxial silicon, silicon germanium (SiGe), germanium (Ge), and/or carbon doped silicon (Si:C) silicon can be doped during deposition (in-situ doped) by adding dopants, such as n-type dopants (e.g., phosphorus or arsenic) or p-type dopants (e.g., boron or gallium), depending on the type of transistor. The dopant concentration in the source/drain can range from $1 \times 10^{19}$ $cm^{-3}$ to $3 \times 10^{21}$ $cm^{-3}$, or preferably between $2 \times 10^{20}$ $cm^{-3}$ to $3 \times 10^{21}$ $cm^{-3}$.

The source/drain regions 304 may each have a width or horizontal thickness (in direction X-X') in the range of about 0.05 to 0.2 micrometers (μm) and a height or vertical thickness (in direction Y-Y') in the range of about 0.05 to 0.2 μm.

The STI regions 306 may be formed of a dielectric material such as silicon oxide (SiOx), silicon nitride (SiN), silicon oxycarbide (SiOC), silicon oxynitride (SiON), or any other suitable dielectric material. Each of the STI regions 306 may have a width or horizontal thickness (in direction X-X') in the range of about 0.05 to 0.2 μm and a height or vertical thickness (in direction Y-Y') in the range of about 0.1 to 0.3 μm.

The gate structures 308 may include a gate dielectric layer that is conformally deposited followed by formation of a gate conductor layer. Each of the gate structures may have a width or horizontal thickness (in direction X-X') in the range of about 0.02 to 0.1 μm and a height or vertical thickness (in direction Y-Y') in the range of about 0.1 to 0.3 µm. More particularly, the gate dielectric layer of the gate structures may have a thickness in the range of about 20-50 Angstrom (A) and the gate conductor layer of the gate structures may have a thickness in the range of about 0.1 to 0.3 µm.

The gate dielectric layer may be formed of a high-k dielectric material. Examples of high-k materials include but are not limited to metal oxides such as hafnium oxide ($HfO_2$), hafnium silicon oxide (Hf—Si—O), hafnium silicon oxynitride (HfSiON), lanthanum oxide ($La_2O_3$), lanthanum aluminum oxide ($LaAlO_3$), zirconium oxide ($ZrO_2$), zirconium silicon oxide, zirconium silicon oxynitride, tantalum oxide ($Ta_2O_5$), titanium oxide ($TiO_2$), barium strontium titanium oxide, barium titanium oxide, strontium titanium oxide, yttrium oxide ($Y_2O_3$), aluminum oxide ($Al_2O_3$), lead scandium tantalum oxide, and lead zinc niobate. The high-k material may further include dopants such as lanthanum (La), aluminum (Al), and magnesium (Mg). The gate dielectric layer may have a uniform thickness in the range of 1 nm to 4 nm.

The gate conductor layer may include a metal gate or work function metal (WFM). In some embodiments, the gate conductor layer is formed using atomic layer deposition (ALD) or another suitable process. For nFET devices, the WFM for the gate conductor layer may be titanium (Ti), aluminum (Al), titanium aluminum (TiAl), titanium aluminum carbon (TiAlC), a combination of Ti and Al alloys, a stack which includes a barrier layer (e.g., of titanium nitride (TiN) or another suitable material) followed by one or more of the aforementioned WFM materials, etc. For pFET devices, the WFM for the gate conductor may be TiN, tantalum nitride (TaN), or another suitable material. In some embodiments, the pFET WFM may include a metal stack, where a thicker barrier layer (e.g., of TiN, TaN, etc.) is formed followed by a WFM such as Ti, Al, TiAl, TiAlC, or any combination of Ti and Al alloys. It should be appreciated that various other materials may be used for the gate conductor layer as desired.

The ILD layer 310 may be formed of silicon dioxide ($SiO_2$) or another silicon oxide (SiOx), SiON, SiOC, etc. The ILD layer 310 may have a height or vertical thickness (in direction Y-Y') in the range of about 0.2 to 0.5 µm.

The source/drain contacts 312 and source/drain contact vias 314 may be formed of tungsten (W) or another suitable material such as copper (Cu), cobalt (Co), titanium (Ti), etc. The source/drain contact vias 314 may have a width or horizontal thickness (in direction X-X') in the range of about 0.05 to 0.2 µm, and a height or vertical thickness (in direction Y-Y') sufficient to connect the source/drain contacts 312 and source/drain regions 304. The source/drain contacts 312 may have a width or horizontal thickness (in direction X-X') in the range of about 0.1 to 0.3 µm and a height or vertical thickness (in direction Y-Y') in the range of about 0.05 to 0.1 µm.

The dielectric capping layer 316 may be formed of an insulator such as silicon nitride (SiN), silicon boron nitride (SiBN), silicon carbon oxygen hydrogen (SiCOH), etc. The insulator material used for the dielectric capping layer 316 is illustratively different than the insulator material used for the ILD layer 310. The dielectric capping layer 316 may have a height or vertical thickness (in direction Y-Y') in the range of about 0.02 to 0.05 µm.

Figure 4:
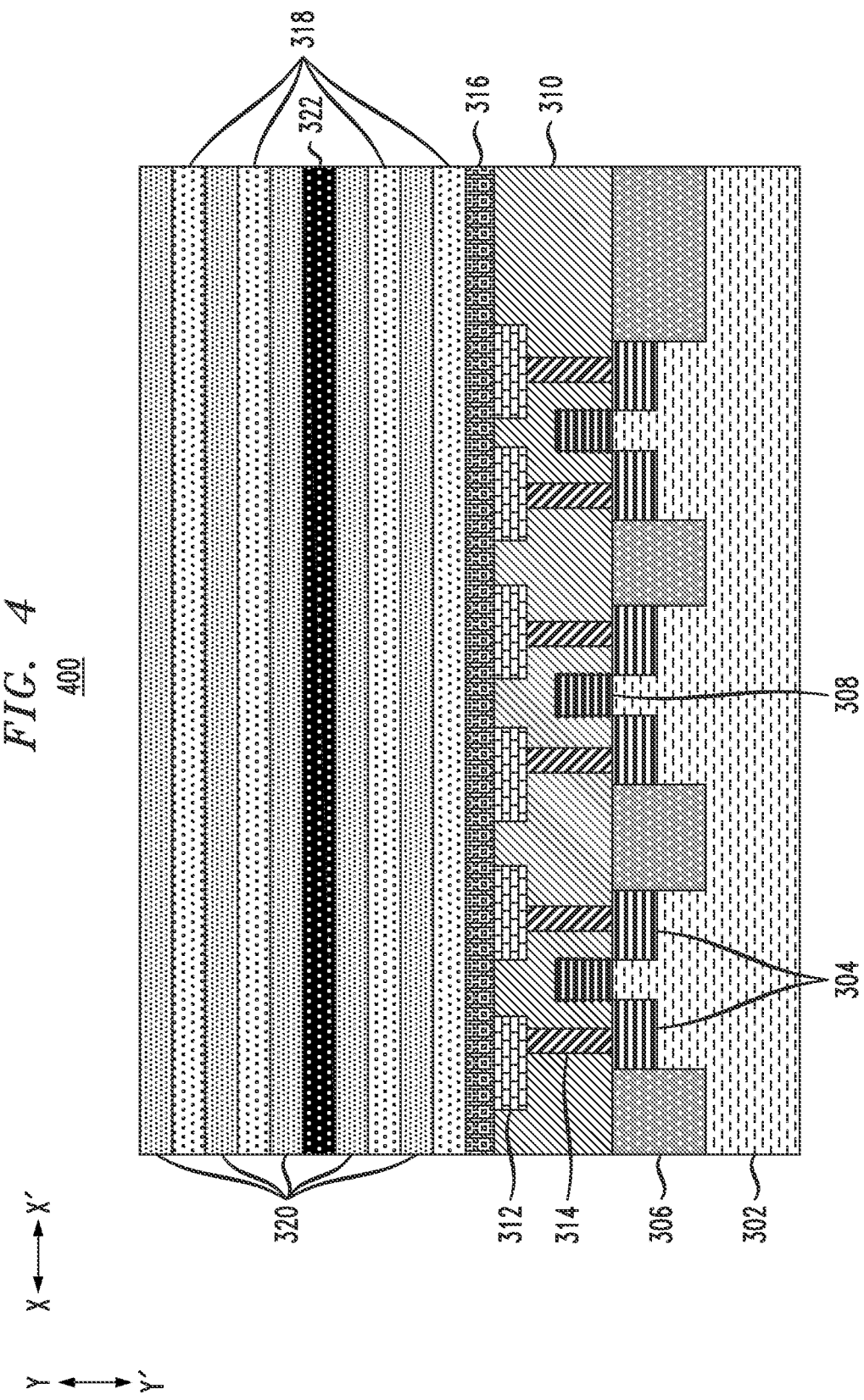
FIG. 4 depicts a side cross-sectional view of the FIG. 3 structure following formation of a wordline stack, according to an embodiment of the invention.

FIG. 4 shows a side cross-sectional view 400 of the FIG. 3 structure following formation of a wordline stack. The wordline stack includes a set of alternating insulator layers 318 and gate or dummy gate layers 320. The wordline stack also includes a sacrificial layer 322 that is used to form an additional bitline as described in further detail below.

The insulator layers 318 may be formed of a nitride such as SiN, or another suitable material such as SiBN, silicon oxynitride (SiON), etc. Each of the insulator layers 318 may have a height or vertical thickness (in direction Y-Y') in the range of about 0.05 to 0.2 µm.

The layers 320 may be formed of a gate material if a gate-first processing flow is utilized, or may be formed of a dummy gate material (e.g., a sacrificial material) if a gate-last processing flow is utilized. The gate material may comprise a metal such as W, TiN, polysilicon (poly-Si) or another suitable material. The dummy gate or sacrificial material may comprise SiO or another suitable insulator, semiconductor or metallic material that can be removed selective to the sacrificial material of sacrificial layer 322. In the description below, the layers 320 are referred to as gate layers 320 for convenience, though it should be appreciated that these layers may be dummy gate layers in gate-last processing flows. Each of the gate layers 320 may have a height or vertical thickness (in direction Y-Y') in the range of about 0.05 to 0.2 µm.

The sacrificial layer 322, also referred to as a bitline middle (BLM) sacrificial layer 322, may be formed of amorphous carbon (a-C), poly-Si, SiC or another suitable material. The BLM sacrificial layer 322 may have a height or vertical thickness (in direction Y-Y') in the range of about 0.05 to 0.2 µm.

The wordline stack of insulator layers 318, gate layers 320 and BLM sacrificial layer 322 provides a vertical NVM structure (e.g., a vertical or 3D NAND or NOR structure). The particular number of insulator layers 318 and gate layers 320 may vary as desired, such as based on the number of FETs to be connected in series as illustrated in FIG. 2. In the FIG. 4 example, there are four sets of insulator layers 318 and gate layers 320 with the BLM sacrificial layer 322 in the middle. As noted above, there may be multiple additional bitlines formed (e.g., there may be multiple BLM sacrificial layers) in other embodiments.

The insulator layers 318, gate layers 320 and BLM sacrificial layer 322 of the wordline stack may be formed using any suitable deposition processes, such as using physical vapor deposition (PVD).

Figure 5:
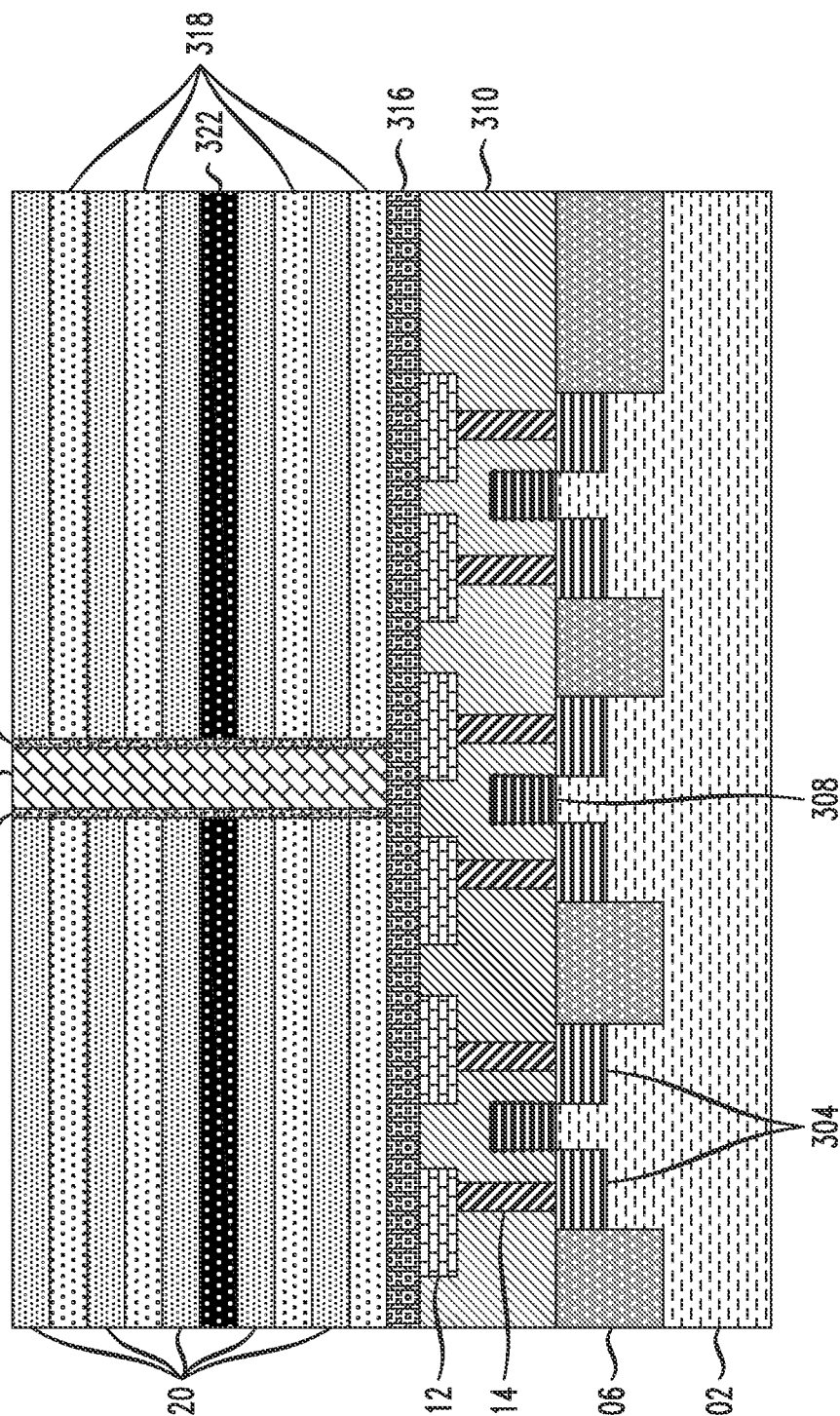
FIG. 5 depicts a side cross-sectional view of the FIG. 4 structure following formation of a floating gate device structure, according to an embodiment of the invention.

FIG. 5 shows a side cross-sectional view 500 of the FIG. 4 structure following formation of a floating gate channel comprising a floating gate liner 324 and a floating FET channel 326, also referred to as channel 326. To form the floating gate channel, a channel hole may first be patterned in the wordline stack and underlying dielectric capping layer 316. This may be achieved by patterning a mask over the wordline stack and etching (e.g., using reactive-ion etching (ME), wet etching, dry etching, etc.). Next, the floating gate liner 324 is formed. The floating gate liner 324 may comprise an oxide-nitride-oxide (ONO) structure or another suitable material such as silicon hafnium oxygen (SiHfO). The floating gate liner 324 traps charges in the channel 326. The floating gate liner 324 may have a width or horizontal thickness (in direction X-X') in the range of about 10 to 50 Å. More particularly, the ONO structure may include oxide layers with thickness in the range of about 10 to 50 Å and a nitride layer with a thickness in the range of about 10 to 50 Å. The floating gate liner 324 is then etched from the bottom, and the channel 326 is deposited. The channel 326 may be formed of poly-Si or another suitable material such as amorphous silicon (a-Si) or silicon germanium (SiGe). The channel 326 may have a horizontal thickness or width (in direction X-X') in the range of about 10 to 50 nanometers (nm). The floating gate liner 324 and channel 326 may then be planarized using chemical mechanical planarization (CMP) or other suitable processing.

Figure 6:
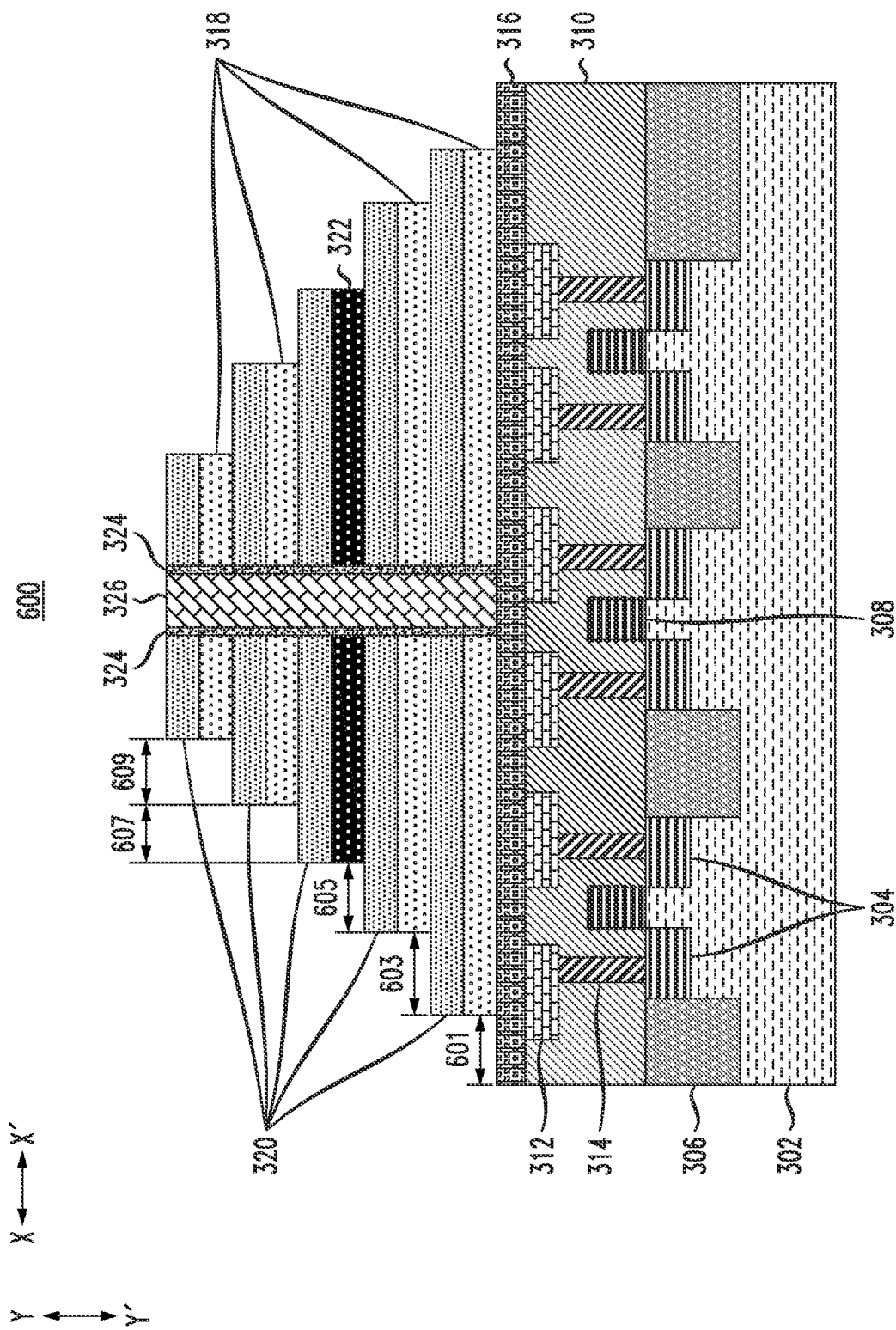
FIG. 6 depicts a side cross-sectional view of the FIG. 5 structure following formation of a staircase structure in the wordline stack, according to an embodiment of the invention.

FIG. 6 shows a side cross-sectional view 600 of the FIG. 5 structure following patterning of a staircase structure in the wordline stack. The staircase structure enables forming of wordline contacts, as well as the additional bitline contact. To form the staircase structure, mask processing may be utilized where a single mask is used with multiple shrinkage of the mask and etching of underlying layers to achieve the structure shown in FIG. 6. FIG. 6 labels the distance (in direction X-X') corresponding to the width of each "step" in the staircase as 601, 603, 605, 607 and 609 (the width of each step is assumed to be the same on both sides of the structure, although only one side is labeled for clarity). Each of the widths 601, 603, 605, 607 and 609 may be in the range of about 0.05 to 0.2 µm.

Figure 7:
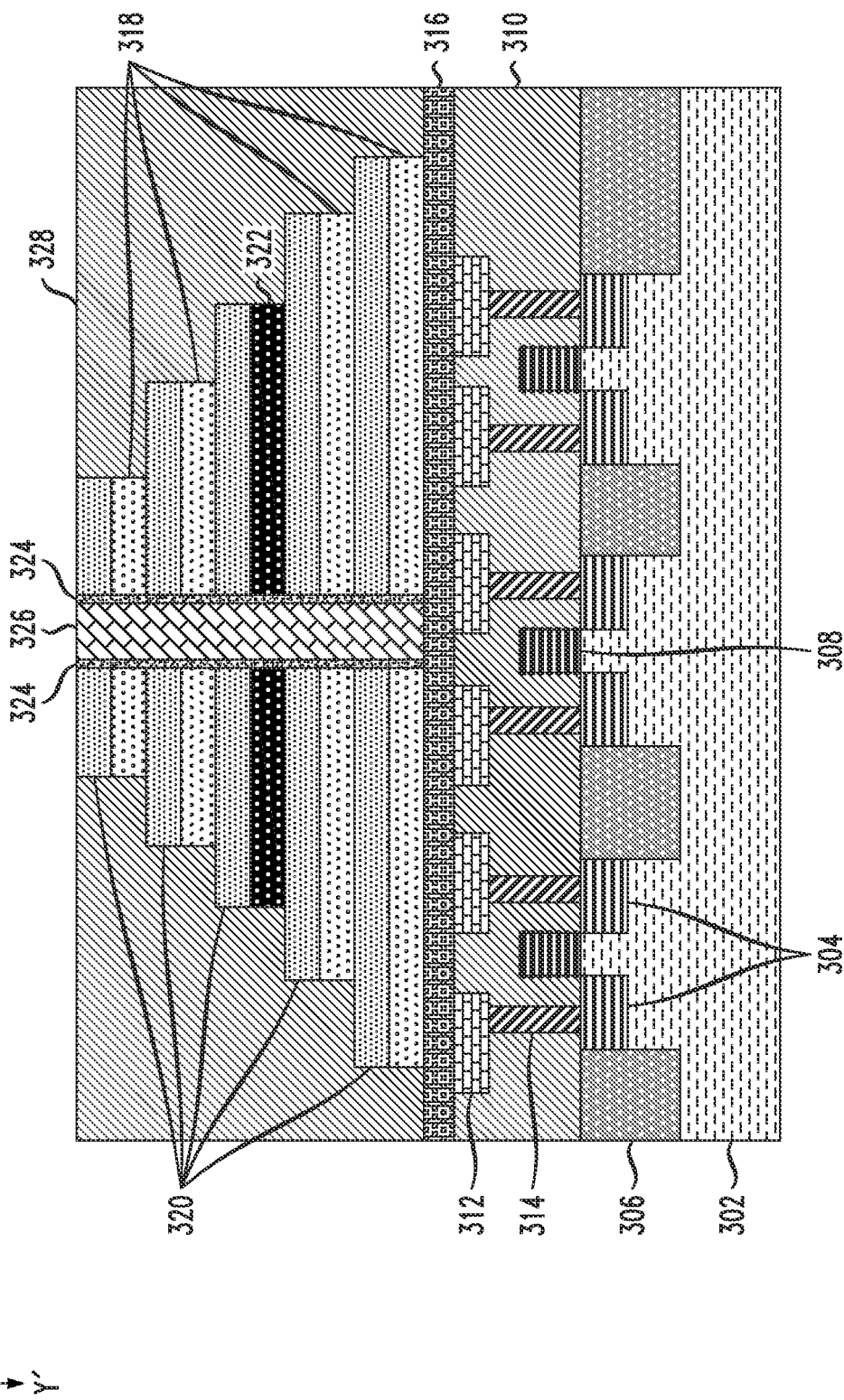
FIG. 7 depicts a side cross-sectional view of the FIG. 6 structure following formation of an interlayer dielectric layer, according to an embodiment of the invention.

FIG. 7 shows a side cross-sectional view 700 of the FIG. 6 structure following formation of an ILD layer 328. The ILD layer 328 may be formed of similar materials as that of the ILD layer 310. The ILD layer 328 may be formed by deposition of the dielectric material followed by planarization using CMP or other suitable processing.

Figure 8:
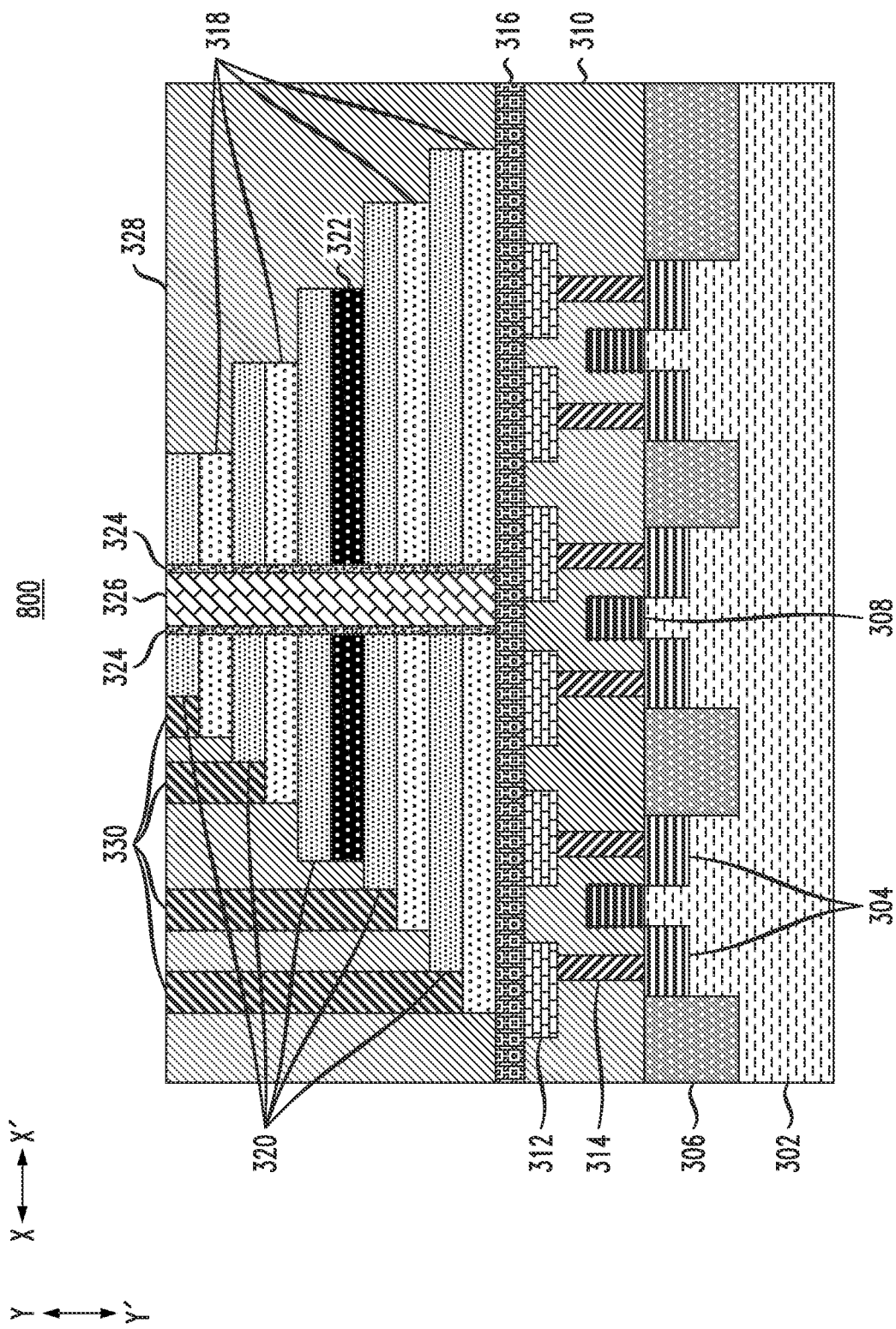
FIG. 8 depicts a side cross-sectional view of the FIG. 7 structure following formation of contacts to the wordlines, according to an embodiment of the invention.

FIG. 8 shows a side cross-sectional view 800 of the FIG. 7 structure following formation of contacts 330, also referred to herein as wordline or WL contacts 330. The WL contacts 330 are for the wordlines in the wordline stack, and contact respective ones of the gate layers 320. The WL contacts 330 may be formed of W or another suitable material such as those described above in conjunction with contact vias 314. In a gate-first flow where the gate layers 320 are formed of metal or another suitable gate material, the WL contacts 330 are formed by using a mask to pattern and etch exposed portions of the ILD layer 328 to form contact holes, followed by deposition and optional planarization of the contact material. In a gate-last flow where the gate layers 320 are formed of a sacrificial or dummy gate material, the WL contacts 330 are formed by using a mask to pattern and etch exposed portions of the ILD layer 328 to form contact holes, followed by removal of the sacrificial dummy gate material, deposition of a gate material, and deposition and optional planarization of the contact material. Each of the WL contacts 330 may have a width or horizontal thickness (in direction X-X') in the range of about 0.05 to 0.1 µm.

Figure 9:
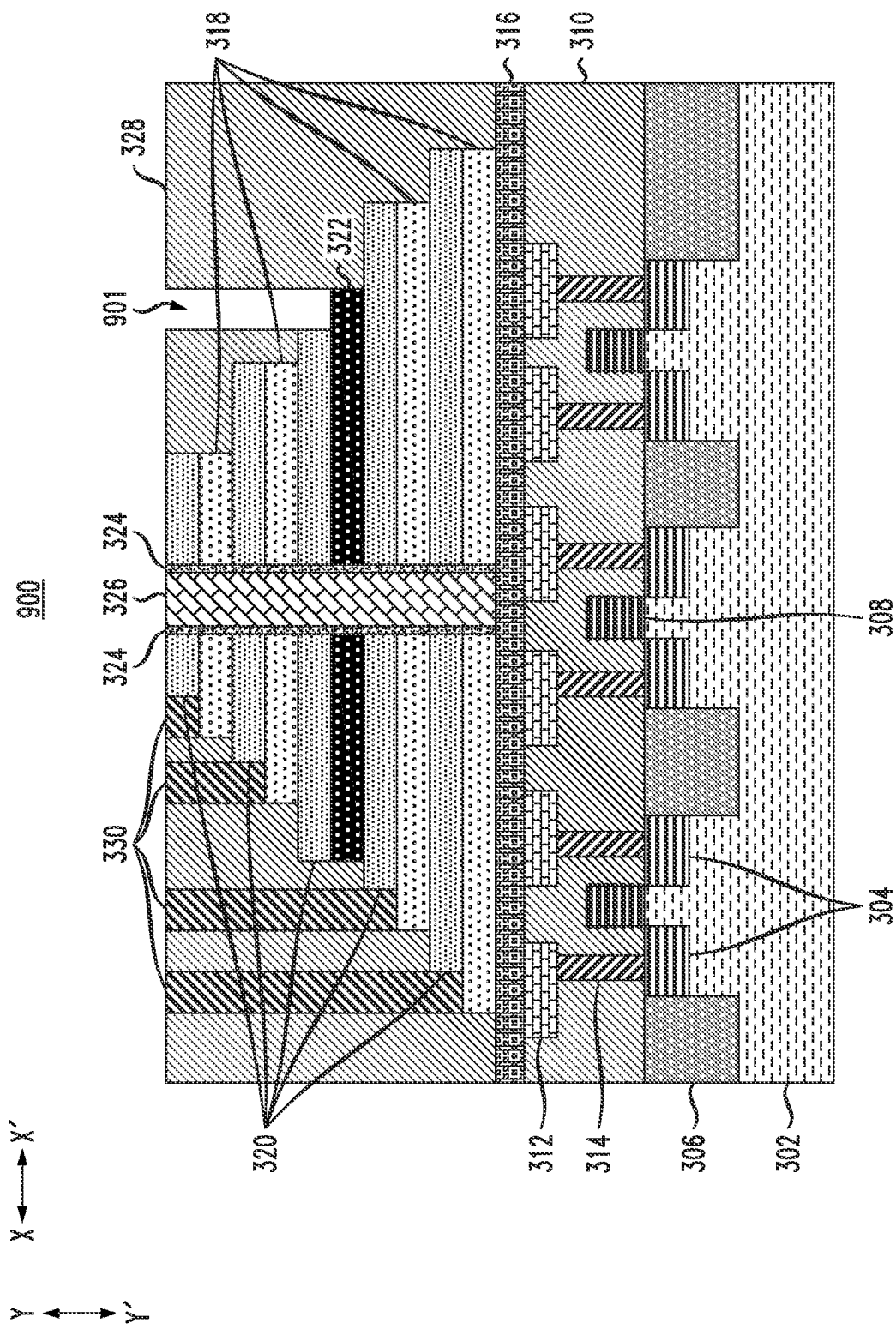
FIG. 9 depicts a side cross-sectional view of the FIG. 8 structure following formation of a contact hole to an additional bitline, according to an embodiment of the invention.

FIG. 9 shows a side cross-sectional view 900 of the FIG. 8 structure following formation of a contact hole 901 to the BLM sacrificial layer 322. The contact hole 901 may be formed by patterning a mask and etching the exposed ILD layer 328. The contact hole 901 may have a width or horizontal thickness (in direction X-X') in the range of about 0.05 to 0.1 µm. Similar to the WL contacts 330, the contact hole 901 is formed to a side of the vertical floating gate device structure. While FIG. 9 shows the contact hole 901 on an opposite side of the vertical floating gate device structure as the WL contacts 330, this is not a requirement. In other embodiments, the contact hole 901 may be formed on the same side of the vertical floating gate device structure as the WL contacts 330. Also, different ones of the WL contacts 330 may be formed on different sides of the vertical floating gate device structure, rather than all of the WL contacts 330 being formed on one side of the vertical floating gate device structure.

Figure 10:
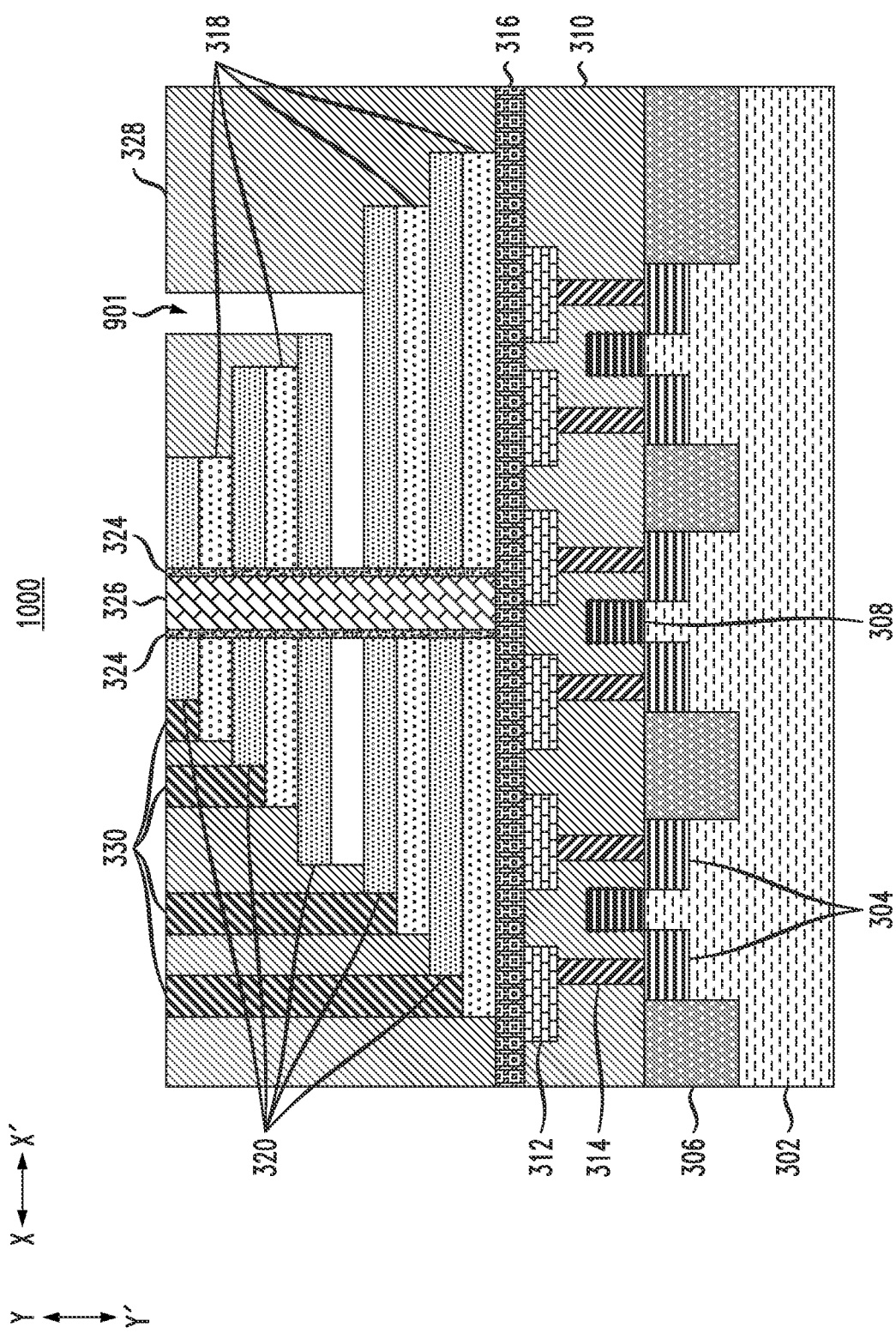
FIG. 10 depicts a side cross-sectional view of the FIG. 9 structure following removal of the additional bitline sacrificial layer, according to an embodiment of the invention.

FIG. 10 shows a side cross-sectional view 1000 of the FIG. 9 structure following removal of the BLM sacrificial layer 322. The BLM sacrificial layer 322 may be removed using a selective etch process, such as wet etching, a gas phase etch, etc.

Figure 11:
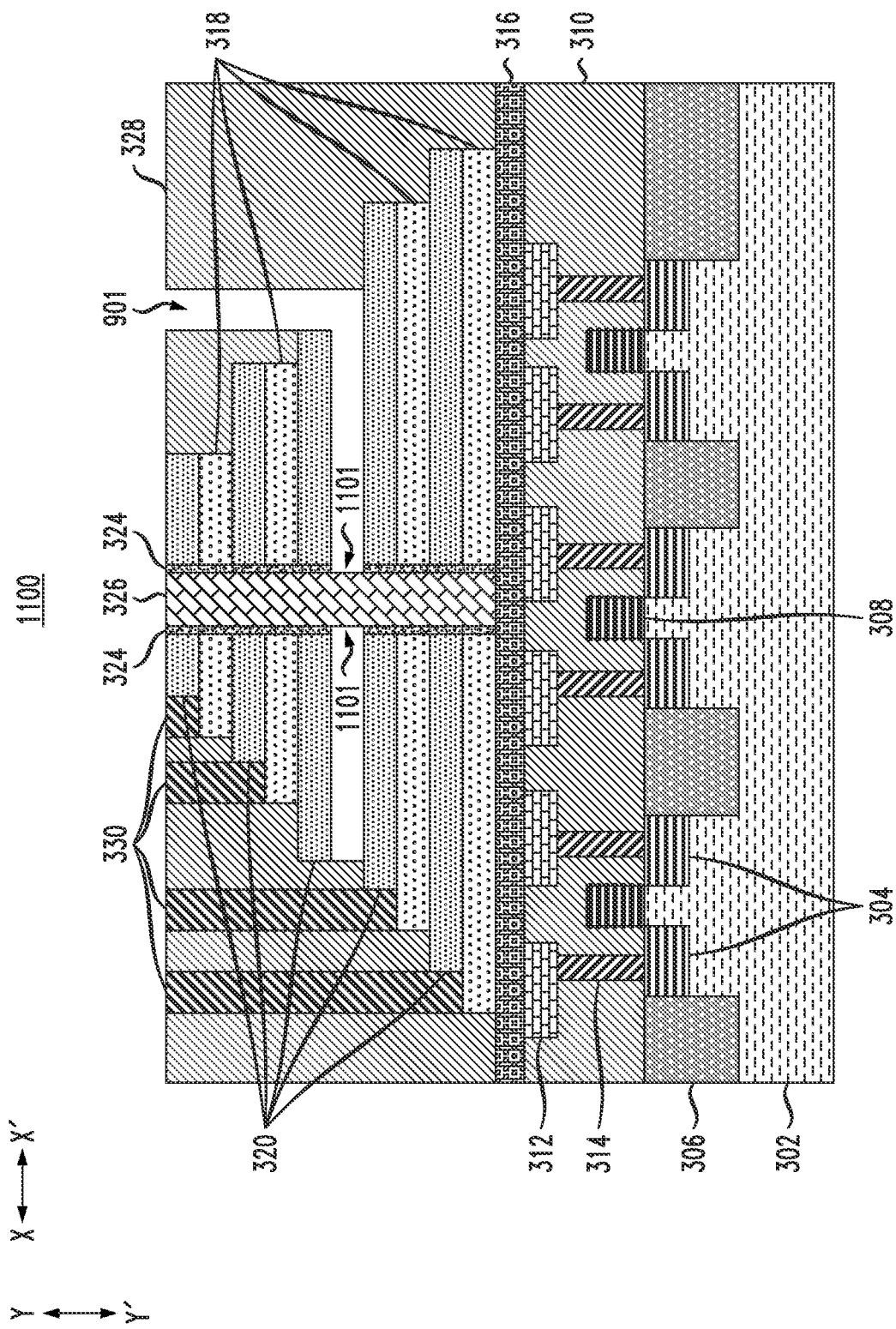
FIG. 11 depicts a side cross-sectional view of the FIG. 10 structure following etching of a floating gate liner layer, according to an embodiment of the invention.

FIG. 11 shows a side cross-sectional view 1100 of the FIG. 10 structure following etching portions of the floating gate liner 324 exposed by removal of the BLM sacrificial layer 322. The exposed portions of the floating gate liner 324 may be removed using a wet etch or other suitable processing leaving exposed areas 1101 of the channel 326 as shown. It should be noted that, in some embodiments, doping can be inserted in this step with gas phase doping.

Figure 12:
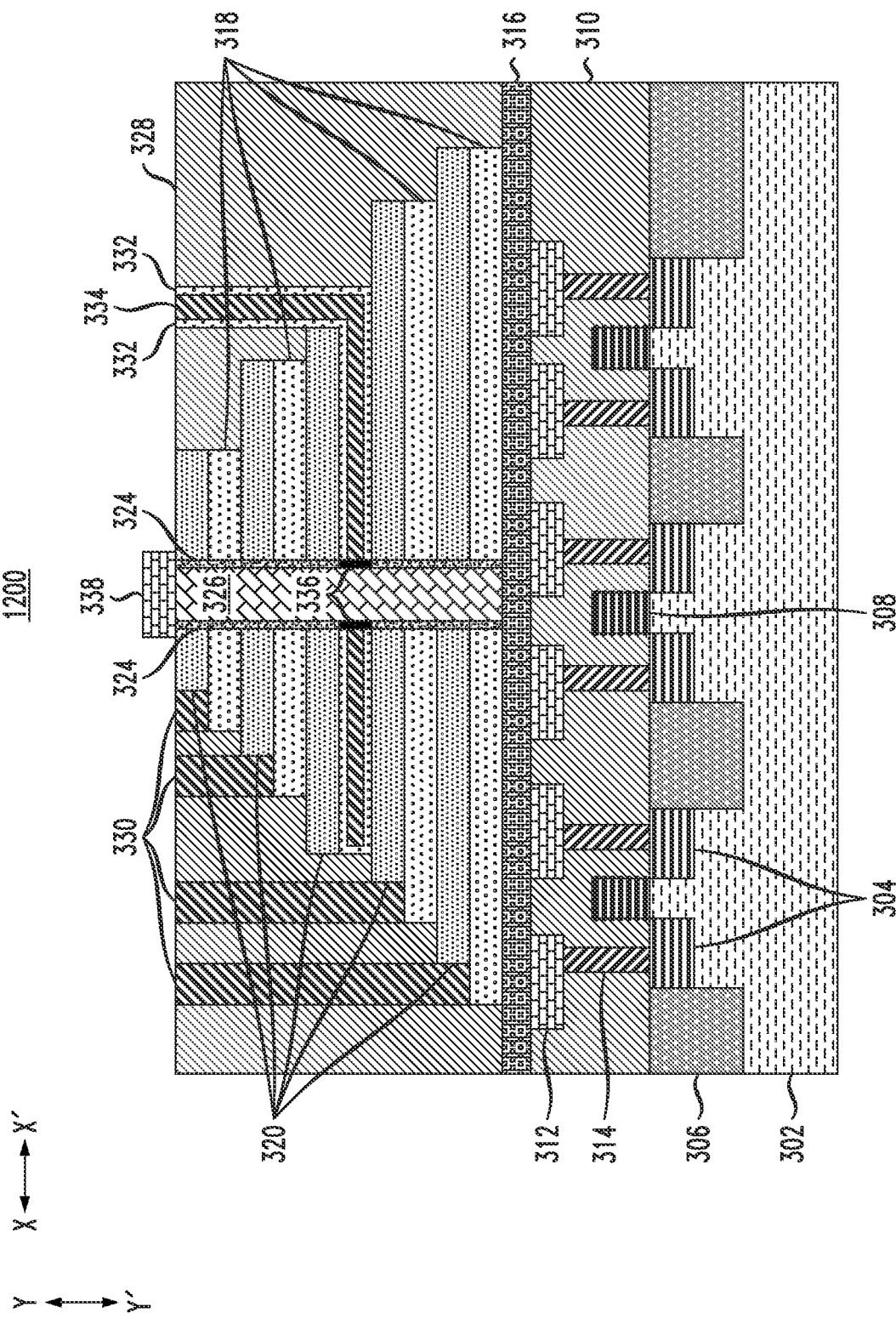
FIG. 12 depicts a side cross-sectional view of the FIG. 11 structure following formation of contacts to the bitline and additional bitline, according to an embodiment of the invention.

FIG. 12 shows a side-cross sectional view 1200 of the FIG. 11 structure following formation of contacts for the bitline (BL) and additional bitline (BLM). For the contact to the additional bitline or BLM, this may involve formation of an optional interfacial layer 332 and a BLM contact layer 334. The interfacial layer 332 may optionally be formed to protect the material of the channel 326 (e.g., poly-Si) during the deposition of material for the BLM contact layer 334. The interfacial layer 332 may be formed of Ti, TiN or another suitable material, with a uniform thickness in the range of about 1 to 10 nm. Formation of the interfacial layer 332 in some embodiments results in formation of a silicide layer 336 where the material of the interfacial layer 332 contacts the channel 326 (e.g., which may be formed of poly-Si). The silicide layer 336 may have a width or horizontal thickness (in direction X-X') in the range of about 1-5 nm. The BLM contact layer 334 may be formed of W or another suitable material similar to those used for WL contacts 330. FIG. 12 further shows a bitline (BL) contact layer 338, which may be formed of W or another suitable material similar to those used for the WL contacts 330. The BL contact layer 338 may have a width or horizontal thickness (in direction X-X') in the range of about 0.05 to 0.1 µm and a height or vertical thickness (in direction Y-Y') corresponding to the dielectric thickness it has to etch through.

FIG. 13A shows a circuit diagram 1300 of a vertical NVM structure with a set of n FETs connected in series, with each of the n FETs corresponding to a cell 1, 2, 3, 4, . . . (n−1), n of a stacked floating gate memory structure. The FIG. 13A circuit diagram utilizes two additional bitline nodes, denoted as BLM1 and BLM2 that are placed in between ones of the n FETs connected in series. To control the cells 1 and 2 on one side of the BLM1 node, BL and BLM1 are used. To control the cells 3 and 4 between the BLM1 and BLM2 nodes, BLM1 and BLM2 are used. To control the cells 5 through n on the other side of the BLM2 node, BLM2 and GND are used.

FIG. 13B shows a side cross-sectional view 1350 of the FIG. 13A circuit structure. The FIG. 13B structure includes a dielectric capping layer 1316, which is similar to the dielectric capping layer 316 and is assumed to be formed over a structure such as that shown in FIG. 3 (e.g., including a substrate 302, source/drain regions 304, STI or isolation regions 306, gate structures 308, an ILD or isolation layer 310, source/drain contacts 312, and source/drain contact vias 314).

The FIG. 13B structure also includes insulating layers 1318 and gate layers 1320 in a wordline stack similar to the insulator layers 318 and gate layers 320 described above, except that the wordline stack in FIG. 13B is larger or taller with a greater number of sets of alternating insulator and gate layers. The FIG. 13B structure further includes a device structure including floating gate liner 1324 and channel 1326 similar to the floating gate liner 324 and channel 326, as well as an ILD layer 1328 and wordline contacts 1330 similar to ILD layer 328 and wordline contacts 330.

In the FIG. 13B structure, there are multiple additional bitlines (e.g., formed using multiple sacrificial layers in the original wordline stack in a manner similar to that described above). Each of the additional bitlines includes an optional interfacial layer 1332, 1342 similar to optional interfacial layer 332 and a BLM contact layer 1334, 1344 similar to the BLM contact layer 334. Also illustrated are silicide layers 1336, 1340 similar to silicide layer 336, and BL contact layer 1338 similar to BL contact layer 338. It should be appreciated that although FIG. 13B shows all the wordline contacts 1330 to one side of the floating gate device structure and the additional bitline contacts on the opposite side of the floating gate device structure, this is not a requirement. In other embodiments, the wordline contacts and additional bitline contacts may be one the same side of the floating gate device structure, there may be at least one wordline contact and at least one additional bitline contact on each side of the floating gate device structure, etc.

In some embodiments, a method of forming a semiconductor structure comprises forming a wordline stack for a non-volatile memory structure over a capping layer, the wordline stack comprising two or more sets of alternating layers of an insulating material and a gate material formed over the insulating material, each of the two or more sets of the insulating material layer and the gate material layer in the wordline stack having a different width. The method also comprises forming a first bitline contact layer between first and second portions of the wordline stack, the first and second portions of the wordline stack each comprising at least one of the two or more sets of the insulating material layer and the gate material layer. The method further comprises forming a floating gate device structure vertically in a channel hole through the wordline stack, the first bitline contact layer and the capping layer. The method further comprises forming wordline contacts to the gate layers in the first and second portions of the wordline stack, the wordline contacts being formed in wordline contact holes spaced apart from vertical sidewalls of the floating gate device structure. The method further comprises forming a first bitline contact to the first bitline contact layer, the first bitline contact being formed in a first bitline contact hole spaced apart from the vertical sidewalls of the floating gate device structure. The method further comprises forming a second bitline contact over at least a portion of a top surface of the floating gate device structure.

The vertical non-volatile memory structure may comprise at least one of a vertical NAND flash memory structure and a vertical NOR flash memory structure.

Reading and writing to memory cells of the vertical non-volatile memory structure in the first portion of the wordline stack may utilize voltages applied to the second bitline contact and a ground voltage, and reading and writing to memory cells of the vertical non-volatile memory structure in the second portion of the wordline stack may utilize voltages applied to the first bitline contact and the second bitline contact.

The wordline contact holes may be spaced apart from a first side of the vertical sidewalls of the floating gate device structure and the first bitline contact hole may be spaced apart from a second side of the vertical sidewalls of the floating gate device structure opposite the first side.

Forming the wordline stack may comprise forming the first portion of the wordline stack over the capping layer, forming a sacrificial layer of the first portion of the wordline stack, and forming the second portion of the wordline stack.

Forming the floating gate device structure may comprise patterning the channel hole through the wordline stack, the sacrificial layer and the capping layer to expose at least a portion of a source/drain contact of a field-effect transistor below the capping layer, forming an oxide-nitride-oxide liner on sidewalls of the channel hole, and forming a polysilicon channel on the oxide-nitride-oxide liner to fill the channel hole.

The method may further comprise forming a staircase structure in the wordline stack and the sacrificial layer by patterning one or more masks over the second portion of the wordline stack and etching portions of the wordline stack and sacrificial layer exposed by the one or more masks such that the sacrificial layer and each of the two or more sets of the insulating layer and the gate layer in the wordline stack have different widths. The method may further comprise forming an interlayer dielectric layer over the capping layer surrounding the wordline stack and the sacrificial layer, patterning the wordline contact holes in the interlayer dielectric layer to the gate layers of the wordline stack, each of the wordline contact holes being spaced apart from the vertical sidewalls of the floating gate device structure, and forming the wordline contacts in the wordline contact holes.

Forming the first bitline contact may comprise patterning the first bitline contact hole in the interlayer dielectric layer to expose a portion of the sacrificial layer spaced apart from the vertical sidewalls of the floating gate device structure, removing the sacrificial layer, forming the first bitline contact layer in the regions exposed by removal of the sacrificial layer, and forming the first bitline contact in the first bitline contact hole to contact the first bitline contact layer.

The method may further comprise etching portions of the floating gate liner exposed by removal of the sacrificial layer, wherein forming the first bitline contact layer and the first bitline contact comprises forming a liner and forming a metal layer over the liner.

The method may further comprise etching portions of the floating gate liner exposed by removal of the sacrificial layer, wherein forming the first bitline contact layer and the first bitline contact comprises forming a silicide layer in regions exposed by etching portion of the floating gate liner, forming a liner, and forming a metal layer over the liner.

The method may further comprise forming a second bitline contact layer between second and third portions of the wordline stack, the third portion of the wordline stack comprising at least one of the two or more sets of the insulating material layer and the gate material layer, and forming a third bitline contact to the second bitline contact layer, the third bitline contact being formed in a second bitline contact hole spaced apart from the vertical sidewalls of the floating gate device structure.

In some embodiments, a semiconductor structure comprises a capping layer and a wordline stack for a vertical non-volatile memory structure disposed over the capping layer, the wordline stack comprising two or more sets of alternating layers of an insulating material and a gate material disposed over the insulating material, each of the two or more sets of the insulating material layer and the gate material layer in the wordline stack having a different width. The semiconductor structure also comprises a first bitline contact layer disposed between first and second portions of the wordline stack, the first and second portions of the wordline stack each comprising at least one of the two or more sets of the insulating material layer and the gate material layer. The semiconductor structure further comprises a floating gate device structure disposed vertically in a channel hole through the wordline stack, the first bitline contact layer and the capping layer. The semiconductor structure further comprises wordline contacts to the gate layers in the first and second portions of the wordline stack, the wordline contacts being disposed in wordline contact holes spaced apart from vertical sidewalls of the floating gate device structure. The semiconductor structure further comprises a first bitline contact to the first bitline contact layer, the first bitline contact being disposed in a first bitline contact hole spaced apart from the vertical sidewalls of the floating gate device structure. The semiconductor structure further comprises a second bitline contact disposed over at least a portion of a top surface of the floating gate device structure.

The vertical non-volatile memory structure may comprise at least one of a vertical NAND flash memory structure and a vertical NOR flash memory structure.

Reading and writing to memory cells of the vertical non-volatile memory structure in the first portion of the wordline stack may utilize voltages applied to the second bitline contact and a ground voltage, and reading and writing to memory cells of the vertical non-volatile memory structure in the second portion of the wordline stack may utilize voltages applied to the first bitline contact and the second bitline contact.

The wordline contact holes may be spaced apart from a first side of the vertical sidewalls of the floating gate device structure and the first bitline contact hole may be spaced apart from a second side of the vertical sidewalls of the floating gate device structure opposite the first side.

In some embodiments, an integrated circuit comprises a vertical non-volatile memory structure comprising a capping layer and a wordline stack for a vertical non-volatile memory structure disposed over the capping layer, the wordline stack comprising two or more sets of alternating layers of an insulating material and a gate material disposed over the insulating material, each of the two or more sets of the insulating material layer and the gate material layer in the wordline stack having a different width. The vertical non-volatile memory structure also comprises a first bitline contact layer disposed between first and second portions of the wordline stack, the first and second portions of the wordline stack each comprising at least one of the two or more sets of the insulating material layer and the gate material layer. The vertical non-volatile memory structure further comprises a floating gate device structure disposed vertically in a channel hole through the wordline stack, the first bitline contact layer and the capping layer. The vertical non-volatile memory structure further comprises wordline contacts to the gate layers in the first and second portions of the wordline stack, the wordline contacts being disposed in wordline contact holes spaced apart from vertical sidewalls of the floating gate device structure. The vertical non-volatile memory structure further comprises a first bitline contact to the first bitline contact layer, the first bitline contact being disposed in a first bitline contact hole spaced apart from the vertical sidewalls of the floating gate device structure. The vertical non-volatile memory structure further comprises a second bitline contact disposed over at least a portion of a top surface of the floating gate device structure.

The vertical non-volatile memory structure may comprise at least one of a vertical NAND flash memory structure and a vertical NOR flash memory structure.

Reading and writing to memory cells of the vertical non-volatile memory structure in the first portion of the wordline stack may utilize voltages applied to the second bitline contact and a ground voltage, and reading and writing to memory cells of the vertical non-volatile memory structure in the second portion of the wordline stack may utilize voltages applied to the first bitline contact and the second bitline contact.

The wordline contact holes may be spaced apart from a first side of the vertical sidewalls of the floating gate device structure and the first bitline contact hole may be spaced apart from a second side of the vertical sidewalls of the floating gate device structure opposite the first side.

It should be understood that the various layers, structures, and regions shown in the figures are schematic illustrations that are not drawn to scale. In addition, for ease of explanation, one or more layers, structures, and regions of a type commonly used to form semiconductor devices or structures may not be explicitly shown in a given figure. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the figures to denote the same or similar features, elements, or structures, and thus, a detailed explanation of the same or similar features, elements, or structures are not repeated for each of the figures. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present, such as ±5%, preferably less than 2% or 1% or less than the stated amount.

In the description above, various materials and dimensions for different elements are provided. Unless otherwise noted, such materials are given by way of example only and embodiments are not limited solely to the specific examples given. Similarly, unless otherwise noted, all dimensions are given by way of example and embodiments are not limited solely to the specific dimensions or ranges given.

Semiconductor devices and methods for forming the same in accordance with the above-described techniques can be employed in various applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

In some embodiments, the above-described techniques are used in connection with semiconductor devices that may require or otherwise utilize, for example, complementary metal-oxide-semiconductors (CMOS s), metal-oxide-semiconductor field-effect transistors (MOSFETs), and/or fin field-effect transistors (FinFETs). By way of non-limiting example, the semiconductor devices can include, but are not limited to CMOS, MOSFET, and FinFET devices, and/or semiconductor devices that use CMOS, MOSFET, and/or FinFET technology.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either: (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a semiconductor structure, comprising:
    forming a wordline stack for a non-volatile memory structure over a capping layer, the wordline stack comprising two or more sets of alternating layers of an insulating material and a gate material formed over the insulating material, each of the two or more sets of the insulating material layer and the gate material layer in the wordline stack having a different width;
    forming a first bitline contact layer between first and second portions of the wordline stack, the first and second portions of the wordline stack each comprising at least one of the two or more sets of the insulating material layer and the gate material layer;
    forming a floating gate device structure vertically in a channel hole through the wordline stack, the first bitline contact layer and the capping layer;
    forming wordline contacts to the gate layers in the first and second portions of the wordline stack, the wordline contacts being formed in wordline contact holes spaced apart from vertical sidewalls of the floating gate device structure;
    forming a first bitline contact to the first bitline contact layer, the first bitline contact being formed in a first bitline contact hole spaced apart from the vertical sidewalls of the floating gate device structure; and
    forming a second bitline contact over at least a portion of a top surface of the floating gate device structure.

2. The method of claim 1, wherein the vertical non-volatile memory structure comprises at least one of a vertical NAND flash memory structure and a vertical NOR flash memory structure.

3. The method of claim 1, wherein reading and writing to memory cells of the vertical non-volatile memory structure in the first portion of the wordline stack utilizes voltages applied to the second bitline contact and a ground voltage, and wherein reading and writing to memory cells of the vertical non-volatile memory structure in the second portion of the wordline stack utilizing voltages applied to the first bitline contact and the second bitline contact.

4. The method of claim 1, wherein the wordline contact holes are spaced apart from a first side of the vertical sidewalls of the floating gate device structure and the first bitline contact hole is spaced apart from a second side of the vertical sidewalls of the floating gate device structure opposite the first side.

5. The method of claim 1 wherein forming the wordline stack comprises:
    forming the first portion of the wordline stack over the capping layer;
    forming a sacrificial layer of the first portion of the wordline stack; and
    forming the second portion of the wordline stack.

6. The method of claim 5, wherein forming the floating gate device structure comprises:
    patterning the channel hole through the wordline stack, the sacrificial layer and the capping layer to expose at least a portion of a source/drain contact of a field-effect transistor below the capping layer;
    forming an oxide-nitride-oxide liner on sidewalls of the channel hole; and
    forming a polysilicon channel on the oxide-nitride-oxide liner to fill the channel hole.

7. The method of claim 6, further comprising forming a staircase structure in the wordline stack and the sacrificial layer by:
    patterning one or more masks over the second portion of the wordline stack; and
    etching portions of the wordline stack and sacrificial layer exposed by the one or more masks such that the sacrificial layer and each of the two or more sets of the insulating layer and the gate layer in the wordline stack have different widths.

8. The method of claim 7, further comprising:
    forming an interlayer dielectric layer over the capping layer surrounding the wordline stack and the sacrificial layer;
    patterning the wordline contact holes in the interlayer dielectric layer to the gate layers of the wordline stack, each of the wordline contact holes being spaced apart from the vertical sidewalls of the floating gate device structure; and
    forming the wordline contacts in the wordline contact holes.

9. The method of claim 8, wherein forming the first bitline contact comprises:
    patterning the first bitline contact hole in the interlayer dielectric layer to expose a portion of the sacrificial layer spaced apart from the vertical sidewalls of the floating gate device structure;
    removing the sacrificial layer;
    forming the first bitline contact layer in the regions exposed by removal of the sacrificial layer; and
    forming the first bitline contact in the first bitline contact hole to contact the first bitline contact layer.

10. The method of claim 9, further comprising etching portions of the floating gate liner exposed by removal of the sacrificial layer, wherein forming the first bitline contact layer and the first bitline contact comprises forming a liner and forming a metal layer over the liner.

11. The method of claim 9, further comprising etching portions of the floating gate liner exposed by removal of the sacrificial layer, wherein forming the first bitline contact layer and the first bitline contact comprises forming a silicide layer in regions exposed by etching portion of the floating gate liner, forming a liner, and forming a metal layer over the liner.

12. The method of claim 1, further comprising:
forming a second bitline contact layer between second and third portions of the wordline stack, the third portion of the wordline stack comprising at least one of the two or more sets of the insulating material layer and the gate material layer; and
forming a third bitline contact to the second bitline contact layer, the third bitline contact being formed in a second bitline contact hole spaced apart from the vertical sidewalls of the floating gate device structure.

13. A semiconductor structure, comprising:
a capping layer;
a wordline stack for a vertical non-volatile memory structure disposed over the capping layer, the wordline stack comprising two or more sets of alternating layers of an insulating material and a gate material disposed over the insulating material, each of the two or more sets of the insulating material layer and the gate material layer in the wordline stack having a different width;
a first bitline contact layer disposed between first and second portions of the wordline stack, the first and second portions of the wordline stack each comprising at least one of the two or more sets of the insulating material layer and the gate material layer;
a floating gate device structure disposed vertically in a channel hole through the wordline stack, the first bitline contact layer and the capping layer;
wordline contacts to the gate layers in the first and second portions of the wordline stack, the wordline contacts being disposed in wordline contact holes spaced apart from vertical sidewalls of the floating gate device structure;
a first bitline contact to the first bitline contact layer, the first bitline contact being disposed in a first bitline contact hole spaced apart from the vertical sidewalls of the floating gate device structure; and
a second bitline contact disposed over at least a portion of a top surface of the floating gate device structure.

14. The semiconductor structure of claim 13, wherein the vertical non-volatile memory structure comprises at least one of a vertical NAND flash memory structure and a vertical NOR flash memory structure.

15. The semiconductor structure of claim 13, wherein reading and writing to memory cells of the vertical non-volatile memory structure in the first portion of the wordline stack is configured to utilize voltages applied to the second bitline contact and a ground voltage, and wherein reading and writing to memory cells of the vertical non-volatile memory structure in the second portion of the wordline stack is configured to utilize voltages applied to the first bitline contact and the second bitline contact.

16. The semiconductor structure of claim 13, wherein the wordline contact holes are spaced apart from a first side of the vertical sidewalls of the floating gate device structure and the first bitline contact hole is spaced apart from a second side of the vertical sidewalls of the floating gate device structure opposite the first side.

17. An integrated circuit comprising:
a vertical non-volatile memory structure comprising:
a capping layer;
a wordline stack for a vertical non-volatile memory structure disposed over the capping layer, the wordline stack comprising two or more sets of alternating layers of an insulating material and a gate material disposed over the insulating material, each of the two or more sets of the insulating material layer and the gate material layer in the wordline stack having a different width;
a first bitline contact layer disposed between first and second portions of the wordline stack, the first and second portions of the wordline stack each comprising at least one of the two or more sets of the insulating material layer and the gate material layer;
a floating gate device structure disposed vertically in a channel hole through the wordline stack, the first bitline contact layer and the capping layer;
wordline contacts to the gate layers in the first and second portions of the wordline stack, the wordline contacts being disposed in wordline contact holes spaced apart from vertical sidewalls of the floating gate device structure;
a first bitline contact to the first bitline contact layer, the first bitline contact being disposed in a first bitline contact hole spaced apart from the vertical sidewalls of the floating gate device structure; and
a second bitline contact disposed over at least a portion of a top surface of the floating gate device structure.

18. The integrated circuit of claim 17, wherein the vertical non-volatile memory structure comprises at least one of a vertical NAND flash memory structure and a vertical NOR flash memory structure.

19. The integrated circuit of claim 17, wherein reading and writing to memory cells of the vertical non-volatile memory structure in the first portion of the wordline stack is configured to utilize voltages applied to the second bitline contact and a ground voltage, and wherein reading and writing to memory cells of the vertical non-volatile memory structure in the second portion of the wordline stack is configured to utilize voltages applied to the first bitline contact and the second bitline contact.

20. The integrated circuit of claim 17, wherein the wordline contact holes are spaced apart from a first side of the vertical sidewalls of the floating gate device structure and the first bitline contact hole is spaced apart from a second side of the vertical sidewalls of the floating gate device structure opposite the first side.

* * * * *